United States Patent
Ng et al.

(10) Patent No.: US 9,229,644 B2
(45) Date of Patent: Jan. 5, 2016

(54) TARGETED COPY OF DATA RELOCATION

(71) Applicant: SanDisk Technologies Inc., Plano, TX (US)

(72) Inventors: Yew Yin Ng, Milpitas, CA (US); Mrinal Kochar, San Jose, CA (US); Niles Yang, Mountain View, CA (US); Deepanshu Dutta, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 246 days.

(21) Appl. No.: 14/089,061

(22) Filed: Nov. 25, 2013

(65) Prior Publication Data

US 2015/0149693 A1    May 28, 2015

(51) Int. Cl.
| | |
|---|---|
| G06F 12/02 | (2006.01) |
| G06F 3/06 | (2006.01) |
| G11C 11/56 | (2006.01) |
| G11C 16/34 | (2006.01) |
| G11C 16/10 | (2006.01) |
| G11C 16/04 | (2006.01) |

(52) U.S. Cl.
CPC ............. *G06F 3/0619* (2013.01); *G06F 3/065* (2013.01); *G06F 3/0652* (2013.01); *G06F 3/0679* (2013.01); *G11C 11/5628* (2013.01); *G11C 16/10* (2013.01); *G11C 16/3431* (2013.01); *G11C 16/3495* (2013.01); *G11C 16/0483* (2013.01); *G11C 2211/5641* (2013.01)

(58) Field of Classification Search
CPC ...... G06F 3/0619; G06F 3/065; G06F 3/0652; G06F 3/0679; G11C 11/5628; G11C 16/10; G11C 16/3495; G11C 16/0483; G11C 2211/5641
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 7,012,835 B2 | 3/2006 | Gonzalez et al. |
| 7,057,939 B2 | 6/2006 | Li et al. |
| 7,173,852 B2 | 2/2007 | Gorobets et al. |
| 8,027,195 B2 | 9/2011 | Li et al. |
| 8,094,500 B2 | 1/2012 | Paley et al. |
| 8,102,705 B2 | 1/2012 | Liu et al. |
| 8,244,960 B2 | 8/2012 | Paley et al. |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

*Primary Examiner* — Hiep Nguyen
(74) *Attorney, Agent, or Firm* — Davis Wright Tremaine LLP

(57) ABSTRACT

In a nonvolatile memory array that has a binary cache formed of SLC blocks and a main memory formed of MLC blocks, corrupted data along an MLC word line is corrected and relocated, along with any other data along the MLC word line, to binary cache, before it becomes uncorrectable. Subsequent reads of the relocated data directed to binary cache.

19 Claims, 13 Drawing Sheets

(56) References Cited

U.S. PATENT DOCUMENTS

| | | | |
|---|---|---|---|
| 8,886,877 B1* | 11/2014 | Avila | G06F 3/0679 |
| | | | 711/103 |
| 2011/0258495 A1* | 10/2011 | Tseng | G11C 16/3418 |
| | | | 714/704 |
| 2012/0220088 A1 | 8/2012 | Alsmeier | |
| 2012/0240012 A1* | 9/2012 | Weathers | G06F 11/1072 |
| | | | 714/773 |
| 2012/0297122 A1 | 11/2012 | Gorobets et al. | |
| 2012/0297140 A1 | 11/2012 | Wu et al. | |
| 2012/0317460 A1* | 12/2012 | Chilappagari | G06F 11/1048 |
| | | | 714/773 |
| 2013/0107628 A1 | 5/2013 | Dong et al. | |
| 2013/0159603 A1* | 6/2013 | Whitney | G06F 12/0246 |
| | | | 711/103 |
| 2013/0254458 A1* | 9/2013 | Pittelko | G06F 12/02 |
| | | | 711/103 |
| 2014/0063955 A1* | 3/2014 | Kawase | G06F 11/1048 |
| | | | 365/185.12 |
| 2014/0146605 A1* | 5/2014 | Yang | G11C 11/5628 |
| | | | 365/185.03 |
| 2015/0012684 A1* | 1/2015 | Avila | G06F 3/0688 |
| | | | 711/103 |
| 2015/0135023 A1* | 5/2015 | Mekhanik | G11C 16/3427 |
| | | | 714/704 |

* cited by examiner

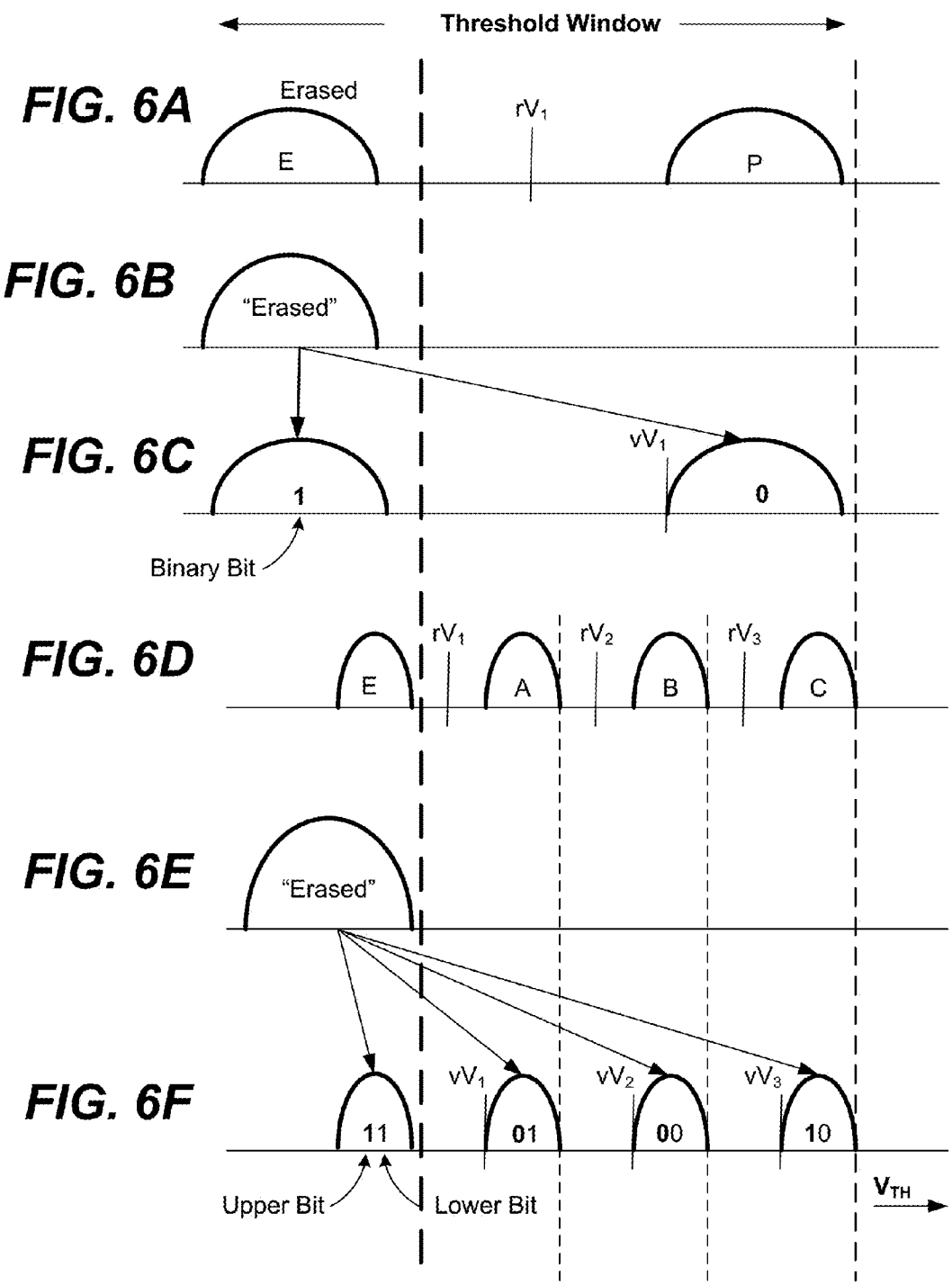

Multistate Memory

Lower Page Programming (2-bit Code)

Upper Page Programming (2-bit Code)

Lower Page Read (2-bit Code)

Upper Page Read (2-bit Code)

TARGETED COPY OF DATA RELOCATION

BACKGROUND

This application relates to the operation of re-programmable non-volatile memory systems such as semiconductor flash memory that can store one or more bits per cell by writing multiple states, and more specifically, to operating such memories in an efficient manner.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. Flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned on to permit conduction between its source and drain regions. Flash memory such as Flash EEPROM allows entire blocks of memory cells to he erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In one common arrangement, individual cells may use two or more memory states to store one or more bits of data Initially, a page of memory cells may be programmed with a "lower page" of data consisting of one bit per cell. Later programming may add an "upper page" of data in the same cells by writing an additional bit in each cell. More than two bits may also be successively stored in this way in some memory systems. In some memories some blocks store just one bit per cell in what may be referred to as Single Level Cell (SLC) blocks while other blocks store two or more bits per cell in what may be referred to as Multi Level Cell (ML( ) blocks. It is desirable to efficiently manage data storage in such memories,

SUMMARY OF THE INVENTION

In a nonvolatile memory array that has a binary cache formed of SLC blocks and a main memory formed of MLC blocks, damaged data along an MLC word line, such as data disturbed by frequent reads, may be identified by ECC. The damaged data along with any other data along the same MLC word line, may then be copied to binary cache before it becomes uncorrectable. Subsequent reads of the relocated data are directed to the copy in faster binary cache rather than the damaged copy in slower MLC main memory. Thus, data is relocated before it becomes uncorrectable. Reading the relocated data is faster which is particularly beneficial for frequently read data.

An example of a method of operating a block-erasable, nonvolatile memory includes: determining that a portion of data that is stored along a word line in a Multi Level Cell (MLC) block is disturbed by more than a threshold amount; identifying at least one other portion of data that is stored along the word line; copying the portion of data and the at least one other portion of data to a Single Level Cell (SLC) block in the nonvolatile memory; and marking the portion of data and the at least one other portion of data that are stored along the word line as obsolete while maintaining valid data in other word lines of the MLC block.

The SLC block may be in a binary cache area of the memory that also contains newly received user data that is not yet stored in any MLC block. The SLC block may contain data copied from additional word lines m additional MLC blocks. The SLC block may contain newly received user data that is not yet stored in any MLC block. The portion of data and the at least one other portion of data may be maintained in the SLC block and the valid data may be maintained in other word lines of the MLC block throughout a period of operation that extends until a subsequent garbage collection operation. The method may also include performing one or more reads of the portion of data or the at least one other portion of data in the SLC block during the period of operation. The method may also include performing one or more reads of valid data in the other word lines of the MLC block during the period of operation. The threshold amount may be a threshold number of bad bits. Determining that the portion of data is disturbed by more than a threshold amount may include reading the portion of data and decoding the read portion of data using Error Correction Code (ECC) decoding. The copying the portion of data and the at least one other portion of data to a Single Level Cell (SLC) block in the nonvolatile memory may include performing ECC correction of the portion of data prior to writing the portion of data to the SLC block.

An example of a method of operating a block-erasable nonvolatile memory array includes: determining that a logical page of data that is stored along a word line in a Multi Level Cell (MLC) block contains more than a threshold number of bad bits; reading all logical pages of data that are stored along the word line; subsequently, performing Error Correction Code (ECC) correction of all logical pages of data that are stored along the word line; subsequently, writing ECC corrected copies of all logical pages of data that are stored along the word line to a binary cache portion of the nonvolatile memory array where valid copies of all logical pages of data that are stored along the word line are stored in Single Level Cell (SLC) format along different word lines; and marking the logical pages of data that are stored along the word line as obsolete while maintaining valid data in other word lines of the MLC block.

The binary cache portion of the memory array may also contain newly received user data that is not yet stored in any MLC block. The binary cache portion of the memory array may also contain valid copies of logical pages from other word lines of other MLC blocks. The method may also include maintaining the valid copies in SLC format and maintaining the valid data in other word lines of the MLC block throughout a period of operation of the nonvolatile memory array during which additional data is written to the MLC block and the binary cache. The valid copies in SLC format and the valid data in other word lines of the MLC block may be read during the period of operation in response to a host read command.

An example of a block-erasable nonvolatile memory system includes: a nonvolatile memory array that includes a Multi Level Cell (MLC) data storage area and a Single Level Cell (SLC) binary cache area; a disturbance detection unit that detects disturbance of stored data along a word line in the MLC data storage area; and a data relocation unit that is configured to relocate disturbed data in units that are smaller than a block from the MLC data storage area to the SLC binary cache area.

The disturbance detection unit may include an Error Correction Code (ECC) unit. The units may be equal in size to the amount of data stored along a word line of the MLC storage area. The MLC data storage area and SLC binary cache area may be formed of blocks of NAND flash memory that are individually configurable as either MLC or SLC blocks.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6F illustrate examples of programming memory cells.

DETAILED DESCRIPTION

Memory System

Figure 1:
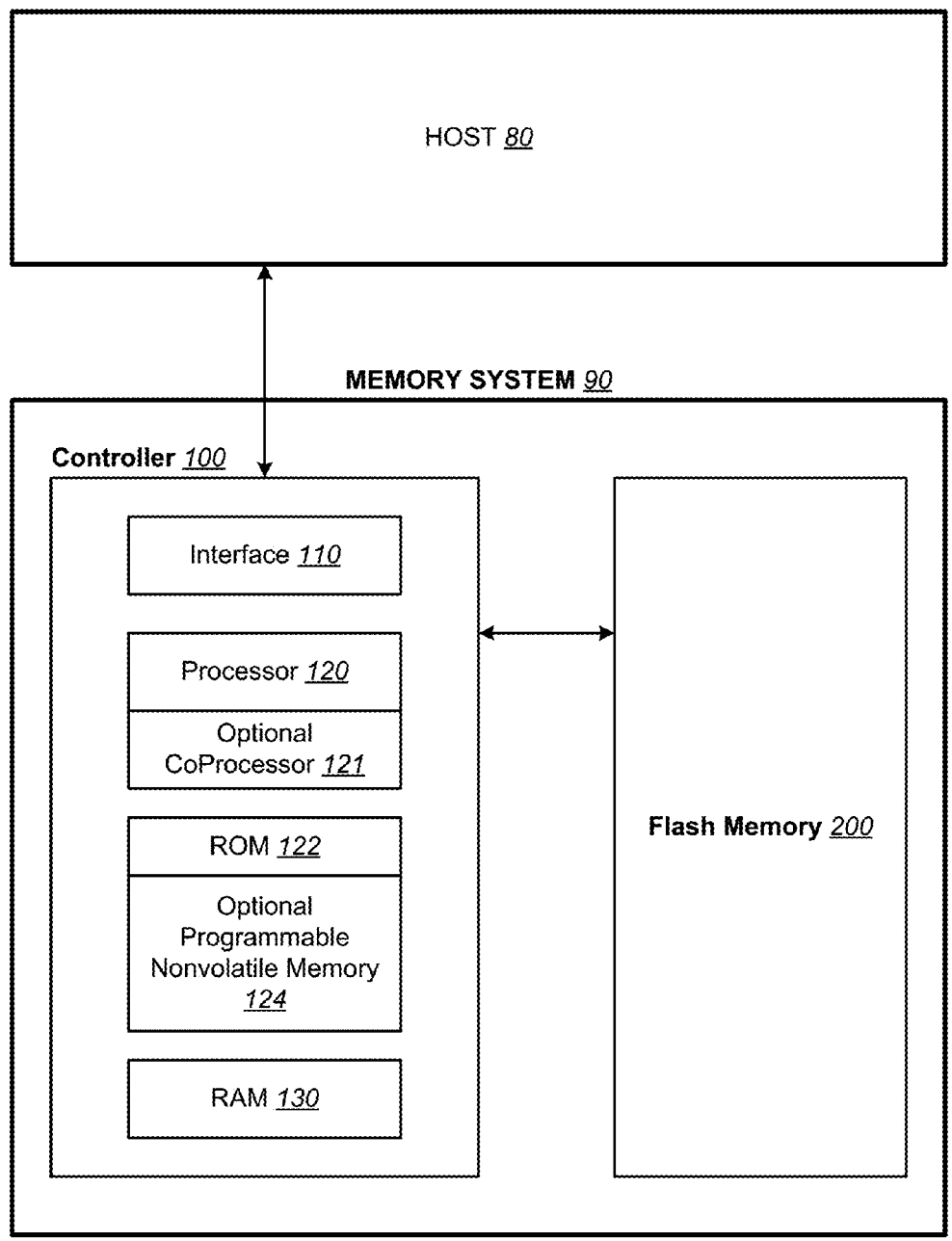
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits, a processor, ROM (read-only-memory), RAM (random access memory), programmable nonvolatile memory, and additional components. The controller is typically formed as an ASIC (application specific integrated circuit) and the components included in such an ASIC generally depend on the particular application.

Physical Memory Structure

Figure 2:
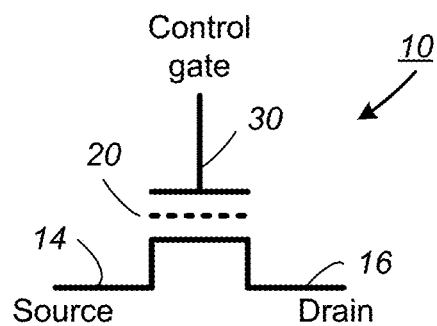
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also examples of memory devices utilizing dielectric storage elements have been described by Eitan et al, "NROM: A Novel Localized Trapping. 2-Bit Nonvolatile Memory Cell," IEEE Electron Device Letters, vol. 21, no. 11. November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
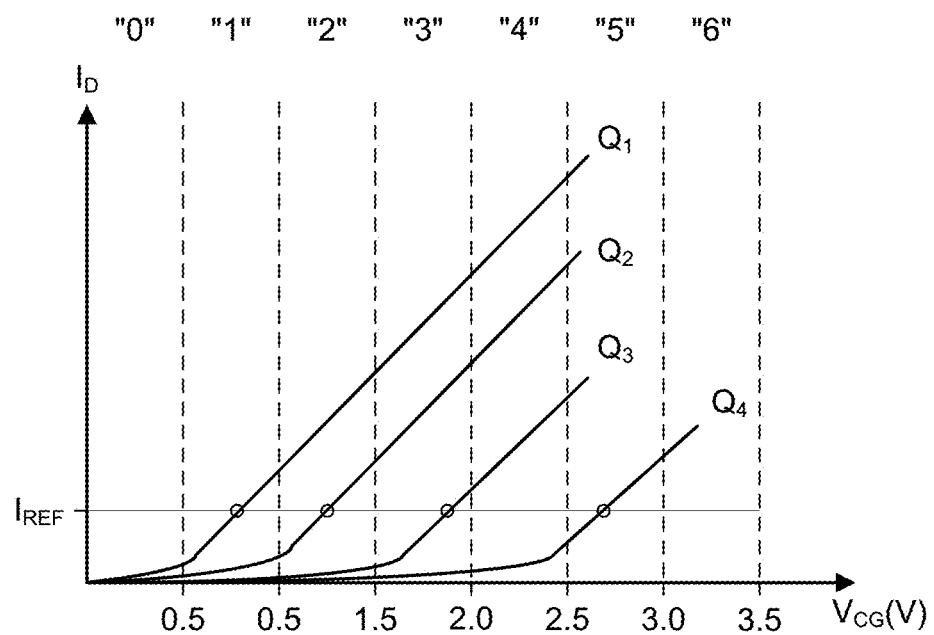
FIG. 3 illustrates the source-drain current $I_D$ and the control gate voltage $V_{CG}$.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2". "3", "4", "5", "6", respectively and one erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
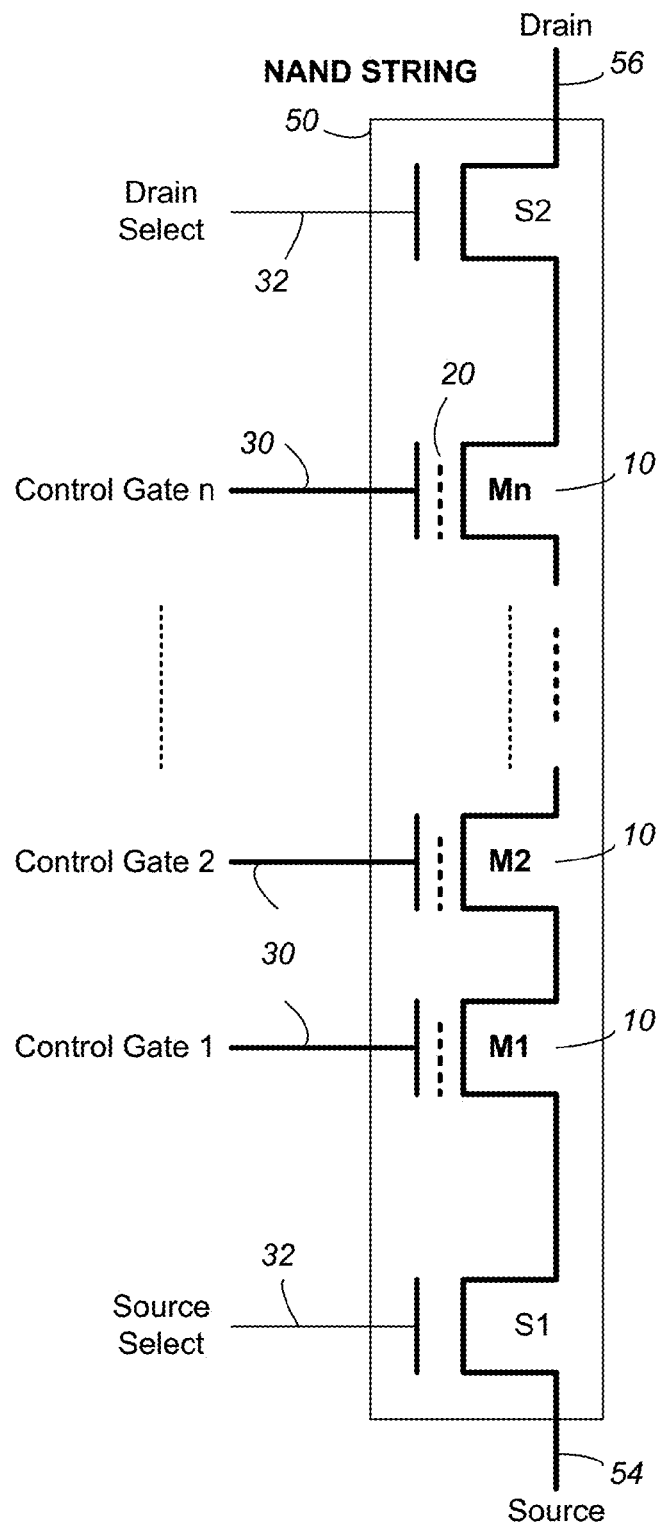
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., need 4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
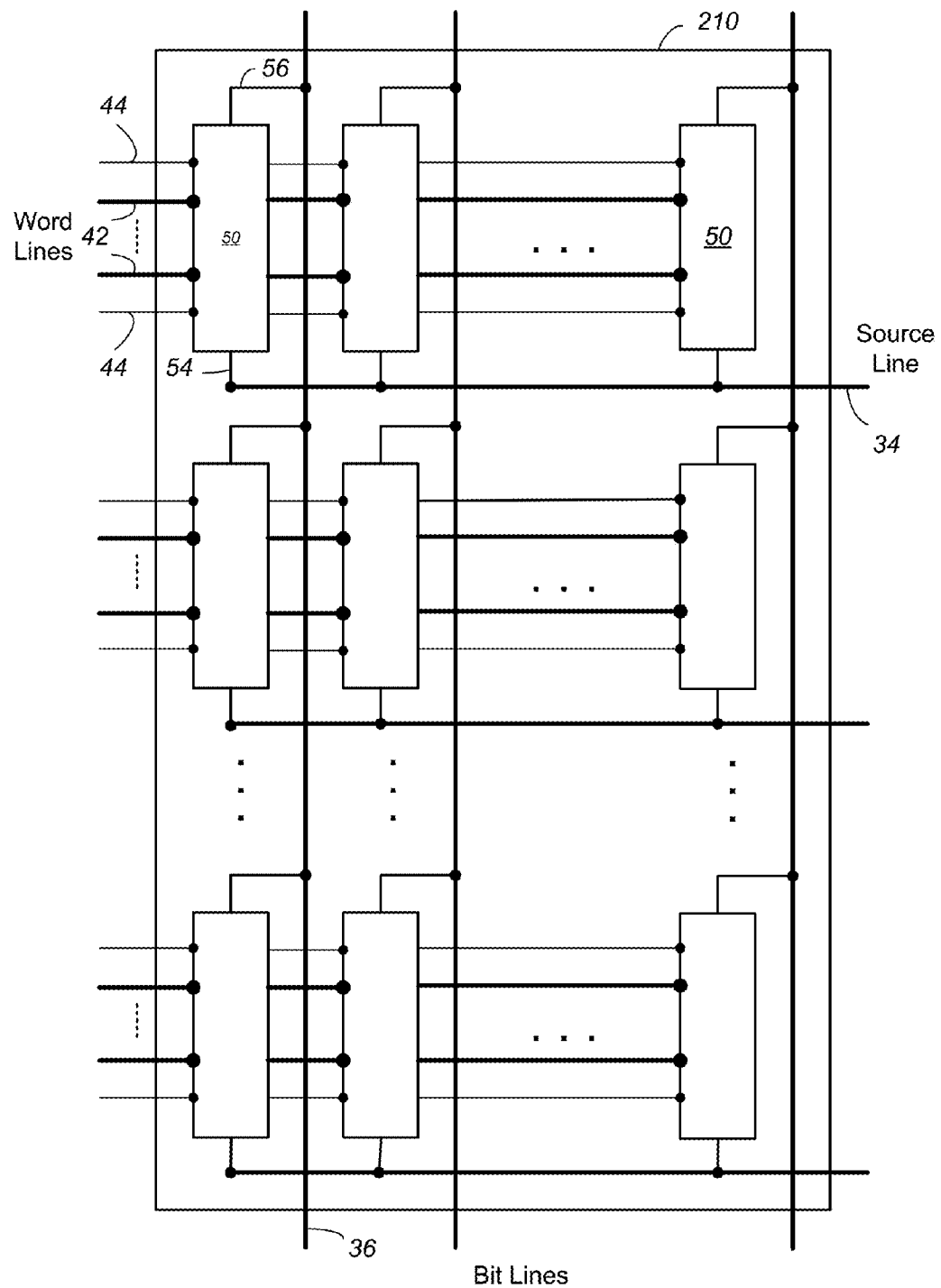
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
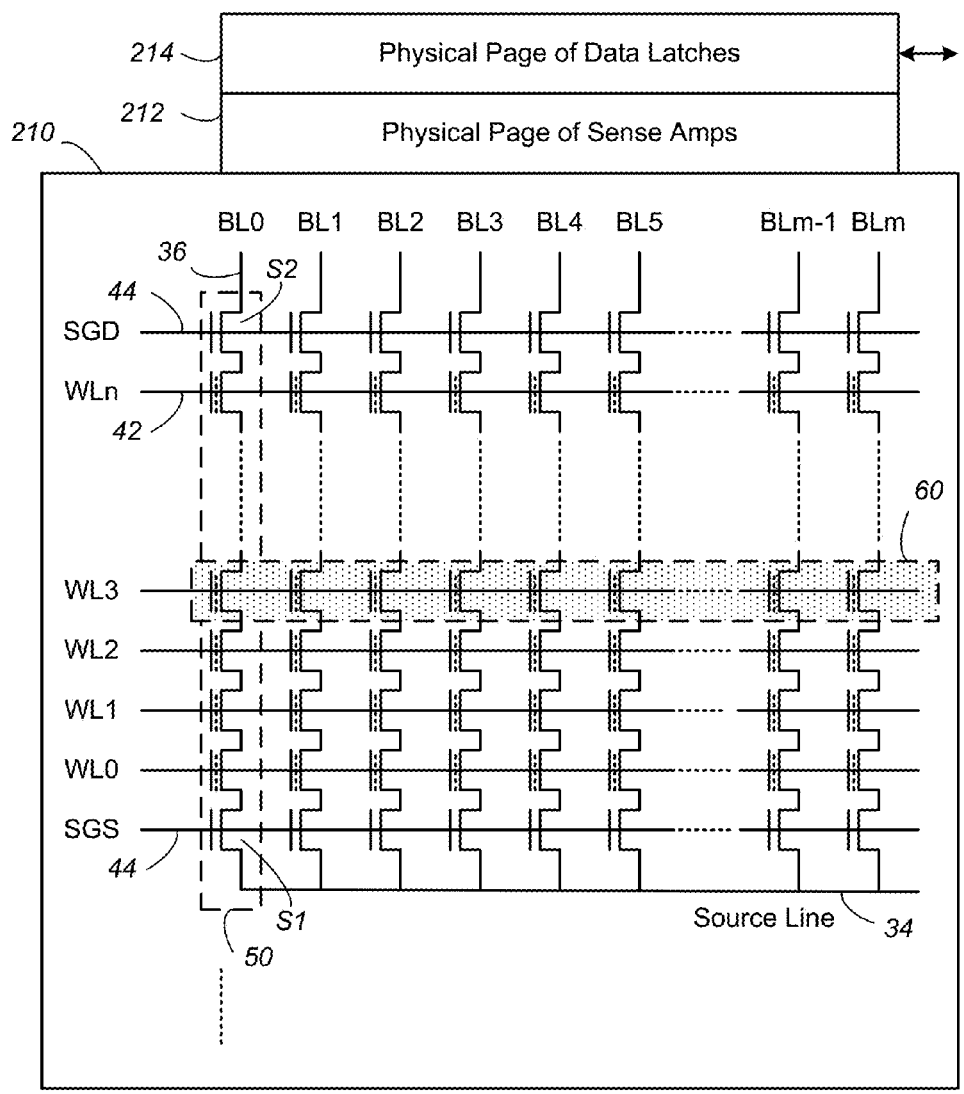
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing data and must be written to a previously unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block, contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

In addition to planar (two dimensional) memory arrays as described above, three dimensional memory arrays are formed with multiple layers of memory cells stacked above each other on a substrate. Examples of such three dimensional memory arrays, their formation, and their operation are described in U.S. Patent Publication Number 2012/0220088 and in U.S. Patent Publication Number 2013/0107628, which are hereby incorporated by reference in their entirety.

SLC and MLC Programming

FIG. 6A-6C illustrate an example of a population of 2-state memory cells (Single Level Cells, or "SLC" cells). FIG. 6A illustrates how the population of memory cells are programmable into two distinct distributions of threshold voltages, an erased state. "E" and a programmed state, "P." Memory cells may be read by determining whether their threshold voltages are above or below a read voltage, $rN_1$. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into a zone demarcated by verify level $vV_1$, In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 6D-6F illustrate an example of programming a population of 4-state memory cells (MLC cells). It will he understood that memory cells may be configurable as either 2-state or 4 state cells so that the same memory cells may be SLC at one time and MLC at another time. Typically memory cells are configured as SLC or MLC on a block by block basis so that all cells of a block are operated together as either an SLC block or an MLC block at any given time. FIG. 6D illustrates the population of memory cells programmable into four distinct distributions of threshold voltages respectively representing memory states "E", "A", "B" and "C". FIG. 6E illustrates the initial distribution of "erased" threshold voltages for an erased memory. FIG. 6F illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$, In this way, each memory cell can be programmed to one of the three programmed states "A", "B" and "C" or remain un-programmed in the erased state. As the memory gets more programming, the initial distribution of the erased state as shown in FIG. 6E will become narrower.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

While the examples above illustrate 2-state SLC operation and 4-state MLC operation, it will be understood that MLC operation is not limited to 4-state examples. For example, eight threshold voltage distributions may be used to store three bits per cell. Other numbers of threshold voltage distributions may be used to store other numbers of bits per cell.

Lower and Upper pages in MLC

Figure 7A:
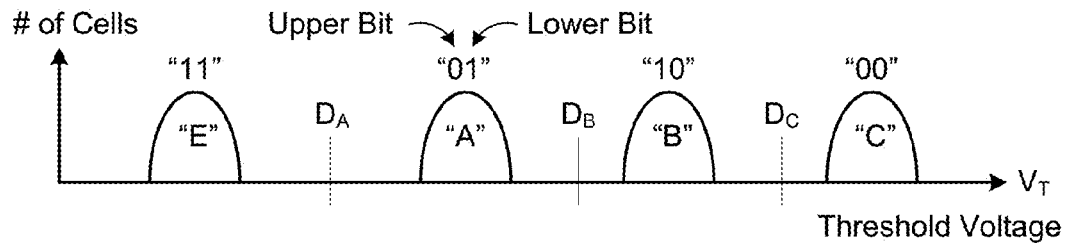
FIGS. 7A-7E illustrates an example of the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
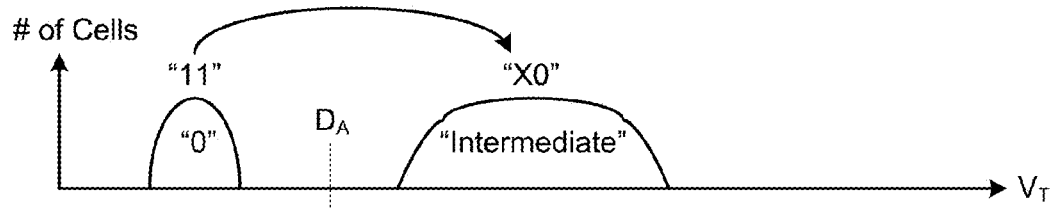
Figure 7C:
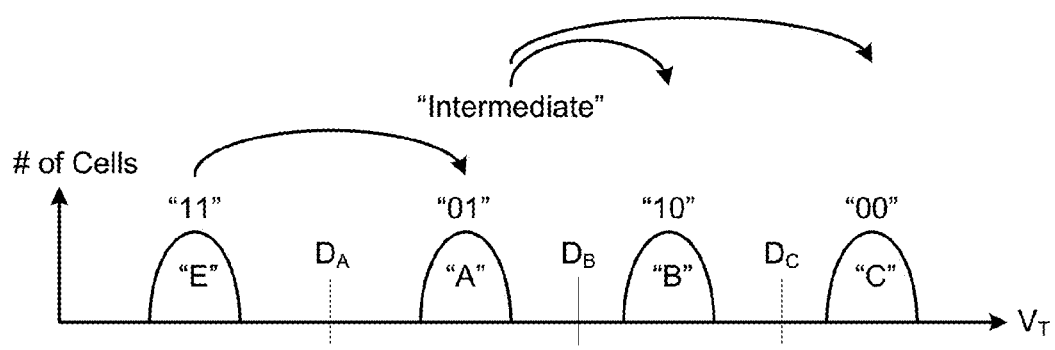

FIG. 7B illustrates the lower page programming (lower bit) in a 2-pass programming scheme using the 2-bit code. The fault-tolerant LM New code essentially avoids any upper page programming to transit through any intermediate states. Thus the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

FIG. 7 illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate," state to "B".

Figure 7D:
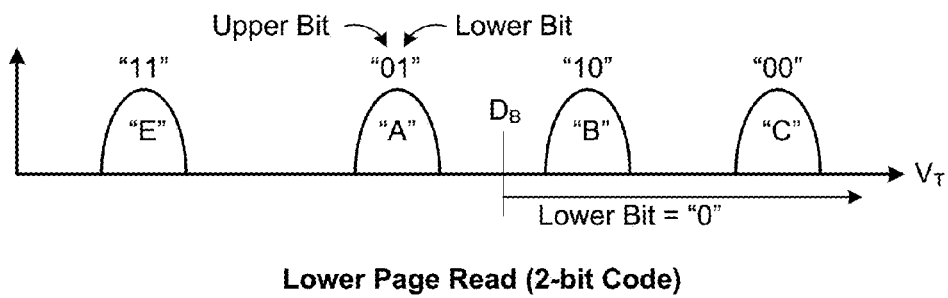

FIG. 7D illustrates the read operation that is required to discern the lower bit of the 4-state memory encoded with the 2-bit code. If the upper page has been programmed and then a readB operation will yield the lower page data correctly. On the other hand, if the upper page has not yet been programmed, the lower page data should be read by a readA operation.

Figure 7E:
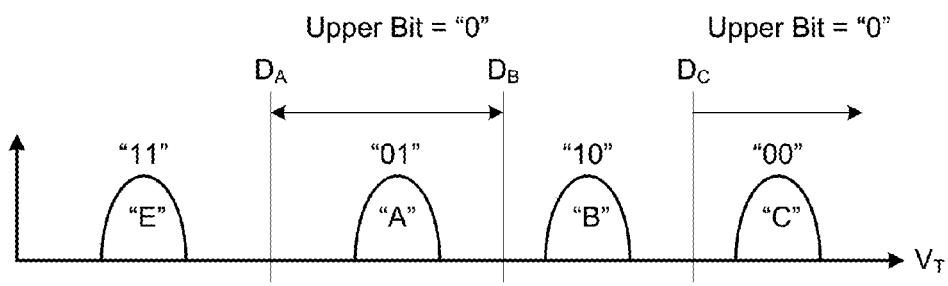

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, in a 3-bit per cell memory, a physical page of memory cells will store three logical pages.

SLC and MLC Operation

It is common to operate some blocks in a memory array in an SLC block and others in an MLC block. For example, data that is expected to be stored for a relatively long period without updates may be stored in MLC blocks while data that is likely to be frequently updated may be stored in SLC. Blocks may be configured as SLC or MLC according to requirements. The faster read and write speeds of SLC generally make it more suitable for frequently updated data while the higher storage density of MLC generally make it more suitable for long term storage.

Figure 8:
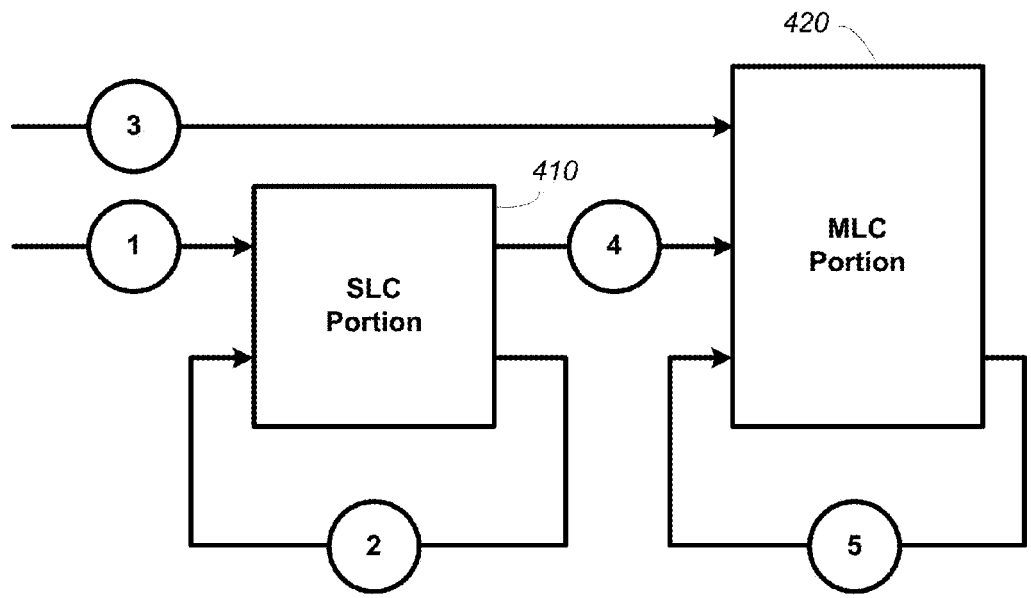
FIG. 8 shows an example of a memory with SLC and MLC portions.

FIG. 8 illustrates schematically the data paths between an SLC portion and an MLC portion in an example of a memory that has both SLC blocks and MLC blocks. This may be considered a two layer system. The first layer is the main input buffer for incoming data and operates on the SLC portion 410 of a NAND memory which is fasterhigher-endurancehigher-cost memory compared to the MLC portion 420. The second layer is the main data archive storage and operates on the MLC portion which is slower/lower-endurance/lower-cost memory.

The main operations in such systems are labeled in FIG. 8 as follows:

1. Host data or control data write to SLC portion
2. Data copy within SLC portion to reclaim partially obsolete SLC block, sometimes referred to as 'compaction'

3. Host data direct write to MLC portion, usually used for long sequential writes 4. Data move from SLC to MLC portion, sometimes referred to as 'folding'

5. Data copy within MLC portion for MLC block reclaim, sometimes referred to as 'MLC compaction'

Figure 9:
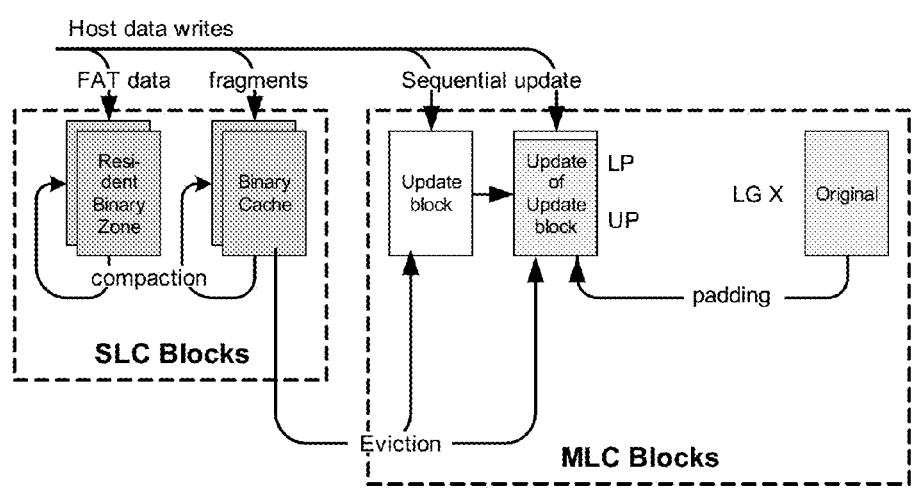
FIG. 9 shows a detailed example of a memory with SLC and MLC portions.

FIG. 9 shows a more detailed example of a memory that includes SLC blocks and MLC blocks. Certain data, including memory management data such as File Allocation Table data ("FAT" data) is always maintained in SLC in this example because it is frequently updated. Short fragments of data are also initially stored in SLC blocks in what is referred to as binary cache. Later such data may be evicted to MLC for longer term storage. Binary cache provides a location where small portions of data (less than a block) can be rapidly stored and generally has data management structures to track locations of such small, frequently-updated, portions of data. Longer portions of sequential data are initially stored in MLC blocks called update blocks. An update block may be maintained for a particular logical address range. If data that is stored in an update block is updated with new data from the host then the newly received data may be written in an update of update block. This makes data in the update block obsolete. The update block is closed and any valid data may be consolidated in the update of update block. The update block may when be erased and the update of update block becomes an update block. Data in such update blocks may be maintained in sequential order so that relatively simple data management structures may be used. A full update block may become an original block which is used for long term storage of data. Detailed examples of different ways to manage SLC blocks and MLC blocks are described in U.S. Pat. No. 8,094,500, and in U.S. Patent Application Publication No. 2012/0277122, which are hereby incorporated by reference in their entirety.

Error Handling

In some cases, data is stored in a memory array and when the stored data is later read from the memory array the copy that is read is not identical to the copy that was stored. This may occur for a number of reasons including physical defects in the memory array, leakage of charge during the time the data is stored, and disturbance caused by access operations (for example, caused by programming neighboring areas of the memory array). In some cases, it has been found that reading stored data, particularly repeated reads of the same data, may cause disturbance to the data being read and/or neighboring data.

In general, when errors occur in data that was stored in a nonvolatile memory array the errors may be corrected by Error Correction Code (ECC) as long as the number of errors is below a maximum number that is correctable by ECC. If the number of errors exceeds the maximum then the data may be considered to be Uncorrectable by ECC (UECC). When such data is encountered the data may be recovered in another way. In some memory systems data portions are subject to an exclusive OR (XOR) operation prior to storage to generate redundancy data. UECC data can be recovered by reversing the XOR operation. Other methods may also be used to recover original data. In general, such recovery methods consume significant time and resources and it is preferable to avoid data becoming UECC.

In some memory systems, data stored in a block is checked to identify damaged data before such data becomes seriously damaged (e.g. UECC). If data in a block is at risk of becoming seriously damaged (e.g. if there are more than a threshold number of errors) then the block may be subject to a scrub operation in which the data is read out of its current location, corrected by ECC (and/or some other technique) and the corrected version is written in a new block. Examples of scrub techniques are described in U.S. Pat. No. 7,173,852.

While scrubbing data may avoid data reaching a seriously damaged state, it may create a significant burden because of the large amount of data that must be copied particularly in MLC blocks where the amount of data is large and programming is relatively slow (compared with SLC). In many cases, such copying is unavoidable because data is approaching a seriously damaged state throughout the block. For example, if one or more word lines (or select lines) in a block become defective (e.g. become shorted) then data may be incorrectly read because the word line(s) may not be appropriately biased to allow correct reading. It will be understood that such word line defects may affect not only data read from the shorted word line(s) but from other word lines also. In particular, such word lines may not allow correct read pass voltages to be applied to all memory cells along the word lines so that the NAND strings containing some of those cells may remain non-conductive during a read causing data to be misread.

While some failure modes cause data throughout a block to be damaged, other failure modes may affect only part of a block. For example, if particular data is frequently read, it has been found that this repeated access may cause the data, and/or neighboring data, to become disturbed. In some cases, when a particular word line is frequently read, data along neighboring word lines may be disturbed because of the read pass voltages applied to them. The number of read operations that cause such damage may depend on the physical structure of the memory array and on the reading scheme used. Unlike the case of a shorted word line, such disturbance generally only affects data along one or more word lines while data along other word lines in the same block remains largely undisturbed. Data along other word lines may remain readable without significant errors.

According to an aspect of the present invention, when data along a particular word line is identified as having a high number of errors (and data along other word lines in the same block do not have high numbers of errors) then the data along the particular word line is read out, corrected by ECC, and written in a different location. All data along the word line is copied in this manner. For an MLC block, there may be multiple logical pages to copy. The data is copied to binary cache. Thus, data is copied from a block where it is stored in an MLC format which may store two or more logical pages along a word line to a block (or blocks) where it is written in SLC format with one logical page along a given word line.

Figures 10, 11A, 11B, 12A, 12B:
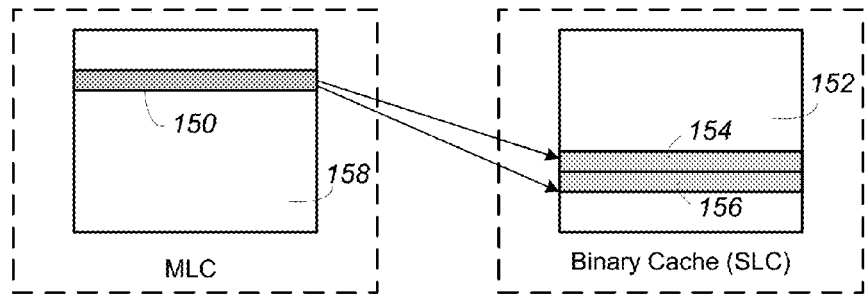
FIG. 10 shows an example of relocating data from a word line in an MLC block.
FIGS. 11A-11B illustrate mapping of logical pages to word lines in eX2 blocks.
FIGS. 12A-12B illustrate mapping of logical pages to word lines in eX3 blocks.

FIG. 10 illustrates copying data of an MLC word line 150 to an SLC block 152 where the upper page data and lower page data are written along separate word lines 154, 156 of the SLC block. It will be understood that the same approach may be used for copying any number of logical pages along a word line (i.e. three or more logical pages may be copied to three or more SLC word lines). This example shows both upper page data and lower page data being written along different word lines of the same SLC block. The MLC block 158 and the SLC block 152 may be in the same plane to facilitate rapid copying. In other examples, upper page data and lower page data may be programmed to two different SLC blocks. For example, they may be programmed in parallel to two different blocks in two different planes in order to rapidly program the data. While the example of FIG. 10 shows copying of data from a single word line, in other examples, data may be copied from more than one word line. For example, data may be copied from word lines that are neighbors of the word line containing damaged data.

The copying shown in FIG. 10 provides two important benefits. Firstly, the data is relocated before it becomes UECC, in a relatively rapid manner (because of the small amount of data relocated and because it is written in SLC). Secondly, the data is subsequently available in binary cache where it can be rapidly read in response to a host read command. For data that is disturbed because of frequent reads, relocating this data to binary cache provides the advantage of allowing faster access for future reads which are likely to be frequent. It may also reduce the chances of further read disturbance because SLC is generally less susceptible to read disturbance as a result of the wider threshold voltage distributions associated with two-state cells. In memories in which frequent reads tend to disturb data of neighboring word lines, data may be copied from neighboring word lines whenever had data is found. In this way, frequently read data may be relocated to binary cache even if the frequently read data itself is not seriously damaged.

MLC Data Relocation

In general, if a logical page of data along a word line in an. MLC block contains a large number of errors, it may be assumed that other logical pages along the same word line are similarly affected. For example, if read disturbance shifts threshold voltage distributions of cells along a word line then all logical pages along the word line are generally affected. Therefore, when a portion of data is identified as seriously damaged, not only the portion of data is copied, all data along the same word line is copied. In order to copy the data, the correct data must be identified.

In an MLC block, lower page and upper page data may be written in different ways. FIG. 11A illustrates a programming scheme in which lower page data is programmed one word line ahead of upper page data Entries in columns for Lower Page "LP" and Upper Page "UP" show the order in which lower and upper page programming occur along word lines of a block. These may correspond to logical addresses of sequential data received from a host (i.e. entries 0-9 represent sequential logical pages 0-9 received from a host). First, the lower page of WL0 is programmed "0," then, instead of programming the upper page of WL0, the lower page of WL1 is programmed "1." Only after the lower page of WL1 is programmed does the programming scheme return to WL0 to program the upper page "2." Thus, logical pages along a particular word line are not sequential in this scheme.

FIG. 11B illustrates the programming scheme of FIG. 11A b$_y$, logical page number. It can be seen that two logical pages along a word line are not sequential but are separated by either one or two intervening logical pages depends on the word line. A scheme to copy data along a word line may refer to such a mapping scheme in order to identify all logical pages along a word line FIG. 12A illustrates a programming scheme for a memory that stores three bits per memory cell (three logical pages per physical page). It can be seen that programming proceeds in a stepped manner so that a given word line stores nonsequential logical pages. FIG. 12B further illustrates how the logical pages stored on a particular word line are nonsequential and arc separated by varying numbers of intervening logical pages. A scheme to copy data along a word line may refer to the relevant mapping scheme, for example in the form of a lookup table, in order to identify all logical pages along a word line.

Figure 13:
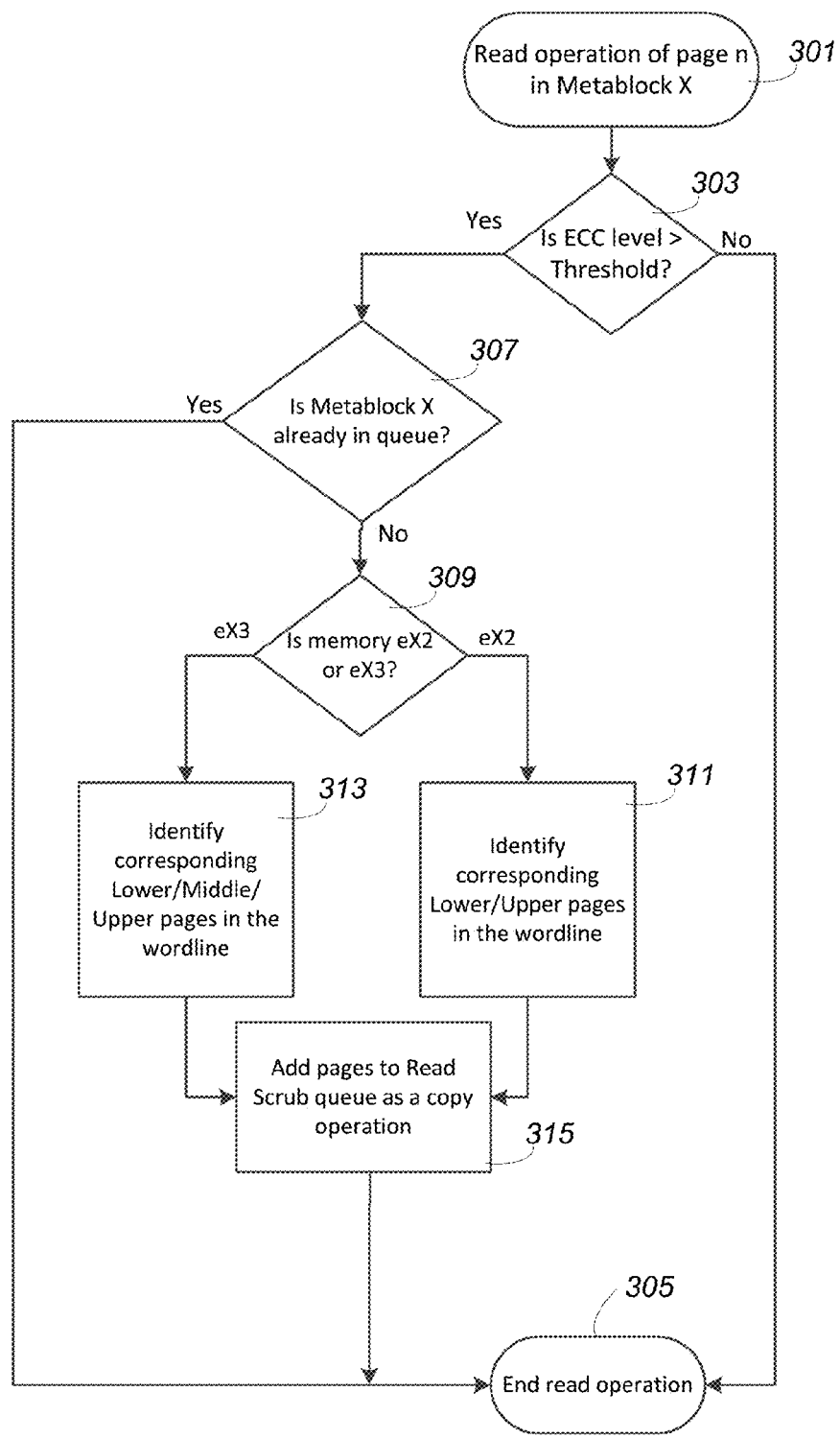
FIG. 13 illustrates a read operation for a page in MLC.

FIG. 13 illustrates a scheme for reading pages and identifying corrupted pages. A particular logical page, logical page n of Metablock X is read out from the memory array 301 and is decoded by ECC to determine if the number of errors (bad bits) exceeds a threshold number 303. It will be understood that a metablock is a set of erase blocks that is operated as a single block (i.e. erased as a unit). If the number of errors is not greater than the threshold number, then the operation ends with respect to logical page n (and may proceed to the next page) 305. If the number of errors exceeds the threshold number then logical page n may be considered corrupted. A determination is then made as to whether the block, or metablock, containing page n is already in a queue to be copied 307. If it is already in such a queue then the operation ends with respect to logical page n 305. If it is not in the queue, then a determination is made as to Whether the block is a two-bit per cell ("eX2") block or a three-bit per cell ("eX3") block 309 (if both types are in use). If it is an eX2 block then logical page n is one of two logical pages stored in a physical page and the other logical page is identified (e.g. from the appropriate map or lookup table as described above) 311. If it is an eX3 block then logical page n is one of three logical pages stored in a physical page and the other two logical pages are identified 313, Logical pages along neighboring word lines may also be identified at this point. Page n and the identified logical pages from the same physical page are then added to a read scrub queue for copying to binary cache 315 (along with logical pages from neighboring word lines in some examples). In some cases, if more than a predetermined number of logical pages in a block are to be copied, it may be preferable to copy the entire block (i.e. switch from word line by word line copying to entire block copying). The read scrub queue may be monitored for such blocks and if any such block is identified the block is then added to a separate queue for block scrub and the individual pages are removed from the read scrub queue.

Figure 14:
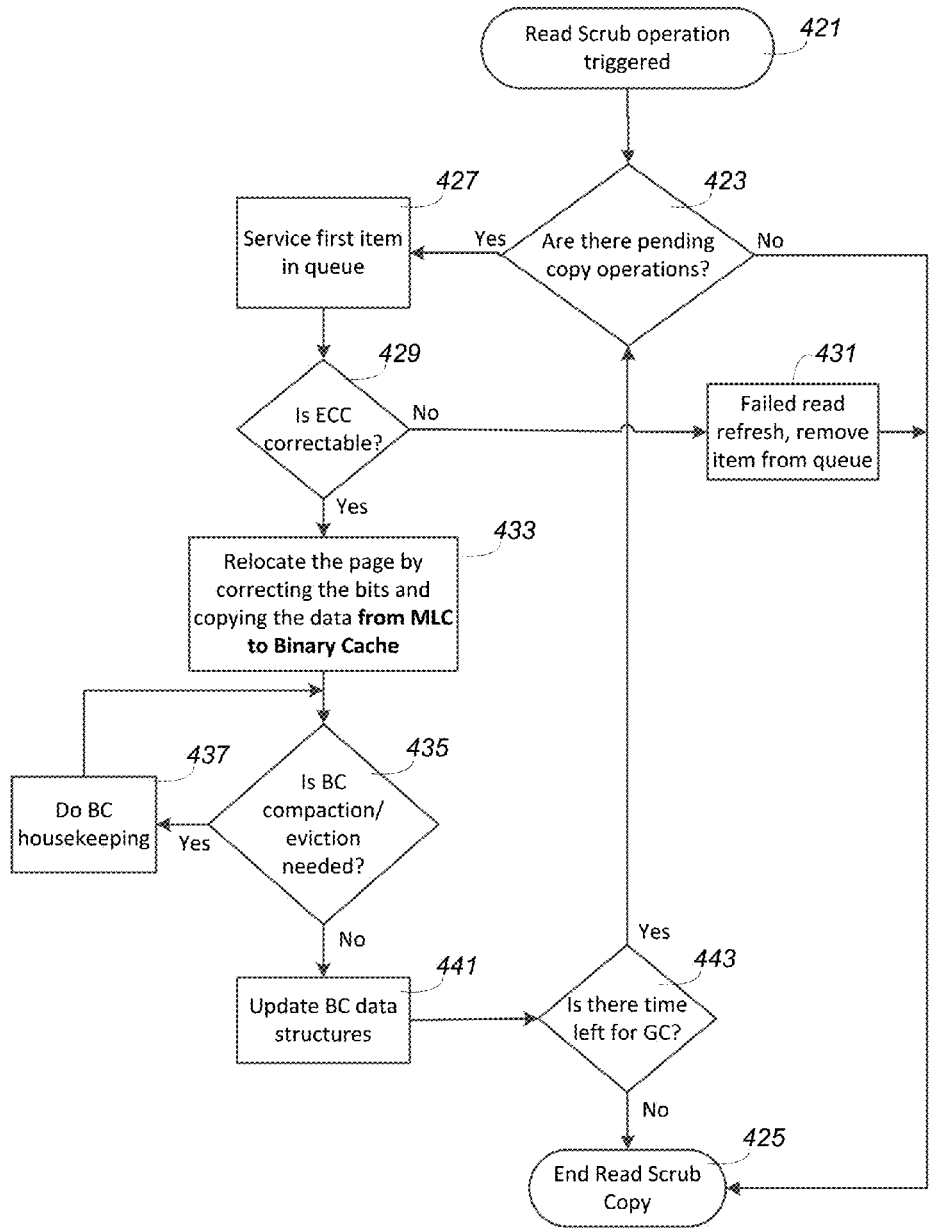
FIG. 14 illustrates a read scrub operation for a page in MLC.

FIG. 14 illustrates how the relocation of pages in the read scrub queue may be performed. A read scrub operation is triggered (e.g. as a background operation) 421. A determination is made as to whether there are any pending copy operations (i.e. whether there are any pages in the read scrub queue) 423. If there are none, then the operation terminates 425. If there are pages in the queue, the first page is serviced first 427. A determination is made as to whether the data is correctable by ECC 429. If it is not (i.e. if it is UECC) then it is removed from the queue 431 and the operation terminates 425 (the page may then be recovered in a different manner). If it is correctable by ECC, then the data is relocated by performing ECC correction of the data and copying the corrected data to binary cache 433. A determination is made as to whether a binary cache compaction/eviction is needed 435, and if it is, then this and any other housekeeping operations are performed 437. Data structures that track locations of data in the binary cache are then updated to reflect the newly written data 441. This ensures that any subsequent reads of the copied data are directed to the copy in binary cache and not to the copy in MLC. A determination is then made as to whether there is time left for garbage collection 443. If there is then the operation returns to the read scrub queue 423 and proceeds to the next item 427.

Figure 15:
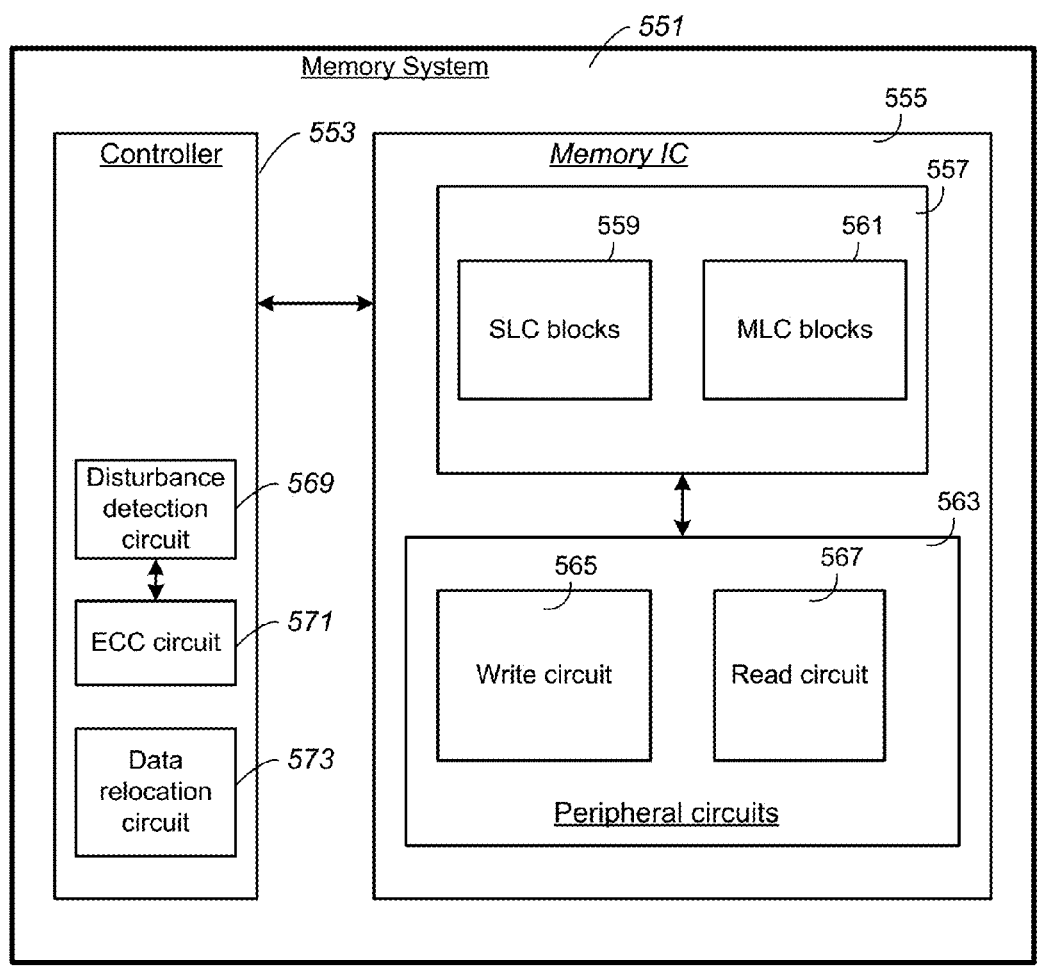
FIG. 15 illustrates an example of hardware that may be used to implement aspects of the present invention.

FIG. 15 shows an example of hardware that may be used to carry out aspects of the present invention. In particular, FIG. 15 shows a memory system 551 that includes a controller 553 and a memory IC 555. The memory IC 555 includes a memory array 557 that has SLC blocks 559 and MLC blocks 561. The memory IC also has peripheral circuits 563 including a write circuit 565 and a read circuit 567. The controller 553 includes a disturbance detection unit 569 that detects disturbed data. The disturbance detection unit 569 is connected to an ECC unit 571 that can determine a number of bad bits in a portion of data. An ECC unit may be considered to be part of a disturbance detection unit in some cases. The controller also includes data relocation unit 573 which is configured to relocate data from one or more word line of an MLC block to the SLC blocks and to update data structures accordingly. It will be understood that controller 553 may be implemented as an Application Specific Integrated Circuit (ASIC) with dedicated circuits for various functions (e.g. a disturbance detection circuit, data relocation circuit, ECC circuit), or may be implemented as a generic controller that is configured by firmware to perform various functions, or may he implemented by a combination of specific firmware operating on an ASIC so that some functions are performed by dedicated ASIC circuits, while other functions are performed by generic circuits in the ASIC that are configured for specific functions by firmware.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a block-erasable nonvolatile memory comprising:
    determining that a portion of data that is stored along a word line in a Multi Level Cell (MLC) block is disturbed by more than a threshold amount;
    identifying at least one other portion of data that is stored along the word line;
    copying the portion of data and the at least one other portion of data to a Single Level Cell (SLC) block in the nonvolatile memory; and
    marking the portion of data and the at least one other portion of data that are stored along the word line as obsolete while maintaining valid data in other word lines of the MLC block.

2. The method of claim 1 wherein the SLC block is in a binary cache area of the memory that also contains newly received user data that is not yet stored in any MLC block.

3. The method of claim 1 wherein the SLC block contains data copied from additional word lines in additional MLC blocks.

4. The method of claim 3 wherein the SLC block contains newly received user data that is not yet stored in any MLC block.

5. The method of claim 1 further comprising, maintaining the portion of data and the at least one other portion of data in the SLC block and maintaining the valid data in other word lines of the MLC block throughout a period of operation that extends until a subsequent garbage collection operation.

6. The method of claim S further comprising: performing one or more reads of the portion of data or the at least one other portion of data in the SLC block during the period of operation.

7. The method of claim 5 further comprising: performing one or more reads of valid data in the other word lines of the MLC block during the period of operation.

8. The method of claim 1 wherein the threshold amount is a threshold number of bad bits.

9. The method of claim 8 wherein the determining that the portion of data is disturbed by more than a threshold amount includes reading the portion of data and decoding the read portion of data using Error Correction Code (ECC) decoding.

10. The method of claim 1 wherein the copying the portion of data and the at least one other portion of data to a Single Level Cell (SLC) block in the nonvolatile memory includes performing ECC correction of the portion of data prior to writing the portion of data to the SLC block.

11. A method of operating a block-erasable nonvolatile memory array comprising:
    determining that a logical page of data that is stored along a word line in a Multi Level Cell (MLC) block contains more than a threshold number of bad bits;
    reading all logical pages of data that are stored along the word line;
    subsequently, performing Error Correction Code (ECC) correction of all logical pages of data that are stored along the word line;
    subsequently, writing ECC corrected copies of all logical pages of data that are stored along the word line to a binary cache portion of the nonvolatile memory array where valid copies of all logical pages of data that are stored along the word line are stored in Single Level Cell (SLC) format along different word lines; and
    marking the logical pages of data that are stored along the word line as obsolete while maintaining valid data in other word lines of the MLC block.

12. The method of claim 11 wherein the binary cache portion of the memory array also contains newly received user data that is not yet stored many MLC block.

13. The method of claim 12 wherein the binary cache portion of the memory array also contains valid copies of logical pages from other word lines of other MLC blocks.

14. The method of claim 11 further comprising maintaining the valid copies in SLC format and maintaining the valid data in other word lines of the MLC block throughout a period of operation of the nonvolatile memory array during which additional data is written to the MLC block and the binary cache.

15. The method of claim 14 wherein the valid copies in SLC format and the valid data in other word lines of the MLC block are read during the period of operation in response to a host read command.

16. A block-erasable nonvolatile memory system comprising:
    a nonvolatile memory array that includes a Multi Level Cell (MLC) data storage area and a Single Level Cell (SLC) binary cache area;
    a disturbance detection unit that detects disturbance of stored data along a word line in the MLC data storage area; and
    a data relocation unit that is configured to relocate disturbed data in units that are smaller than a block from the MLC data storage area to the SLC binary cache area.

17. The block-erasable nonvolatile memory system of claim 16 wherein the disturbance detection unit includes an Error Correction Code (ECC) unit.

18. The block-erasable nonvolatile memory system of claim 16 wherein the units are equal in size to the amount of data stored along a word line of the MLC storage area.

19. The block-erasable nonvolatile memory system of claim 16 wherein the MLC data storage area and SLC binary cache area are formed of blocks of NAND flash memory that are individually configurable as either MLC or SLC blocks.

* * * * *

UNITED STATES PATENT AND TRADEMARK OFFICE
CERTIFICATE OF CORRECTION

PATENT NO. : 9,229,644 B2  
APPLICATION NO. : 14/089061  
DATED : January 5, 2016  
INVENTOR(S) : Ng et al.

Page 1 of 1

It is certified that error appears in the above-identified patent and that said Letters Patent is hereby corrected as shown below:

IN THE CLAIMS  
Column 14, line 31, please delete "many" and insert -- in any --.

Signed and Sealed this  
Twenty-sixth Day of April, 2016

Michelle K. Lee  
*Director of the United States Patent and Trademark Office*